(12) United States Patent
Bencher et al.

(10) Patent No.: US 10,495,979 B1
(45) Date of Patent: Dec. 3, 2019

(54) HALF TONE SCHEME FOR MASKLESS LITHOGRAPHY

(71) Applicant: Applied Materials, Inc., Santa Clara, CA (US)

(72) Inventors: Christopher Dennis Bencher, Cupertino, CA (US); Joseph R. Johnson, Redwood City, CA (US); Thomas L. Laidig, Richmond, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/279,877

(22) Filed: Feb. 19, 2019

(51) Int. Cl.
*G03F 7/20* (2006.01)
*G02F 1/13* (2006.01)
*G03F 7/09* (2006.01)

(52) U.S. Cl.
CPC ........ *G03F 7/70291* (2013.01); *G02F 1/1303* (2013.01); *G03F 7/094* (2013.01); *G03F 7/70008* (2013.01); *G03F 7/70383* (2013.01)

(58) Field of Classification Search
None
See application file for complete search history.

(56) References Cited

U.S. PATENT DOCUMENTS

| | | | |
|---|---|---|---|
| 6,831,768 B1 | 12/2004 | Cebuhar et al. | |
| 2016/0246100 A1* | 8/2016 | Kim | ................... G02F 1/136209 |
| 2017/0003598 A1* | 1/2017 | Johnson | .............. G03F 7/70041 |

* cited by examiner

*Primary Examiner* — Michelle M Iacoletti
(74) *Attorney, Agent, or Firm* — Patterson & Sheridan, LLP

(57) ABSTRACT

Embodiments described herein provide a system, a software application, and a method of a lithography process, to write full tone portions and grey tone portions in a single pass. One embodiment includes a controller configured to provide mask pattern data to a lithography system. The controller is configured to divide a plurality of spatial light modulator pixels spatially by at least a grey tone group and a full tone group of spatial light modulator pixels. When divided by the controller, the grey tone group of spatial light modulator pixels is operable to project a first number of the multiplicity of shots to the plurality of full tone exposure polygons and the plurality of grey tone exposure polygons, and the full tone group of spatial light modulator pixels is operable to project a second number of the multiplicity of shots to the plurality of full tone exposure polygons.

20 Claims, 14 Drawing Sheets

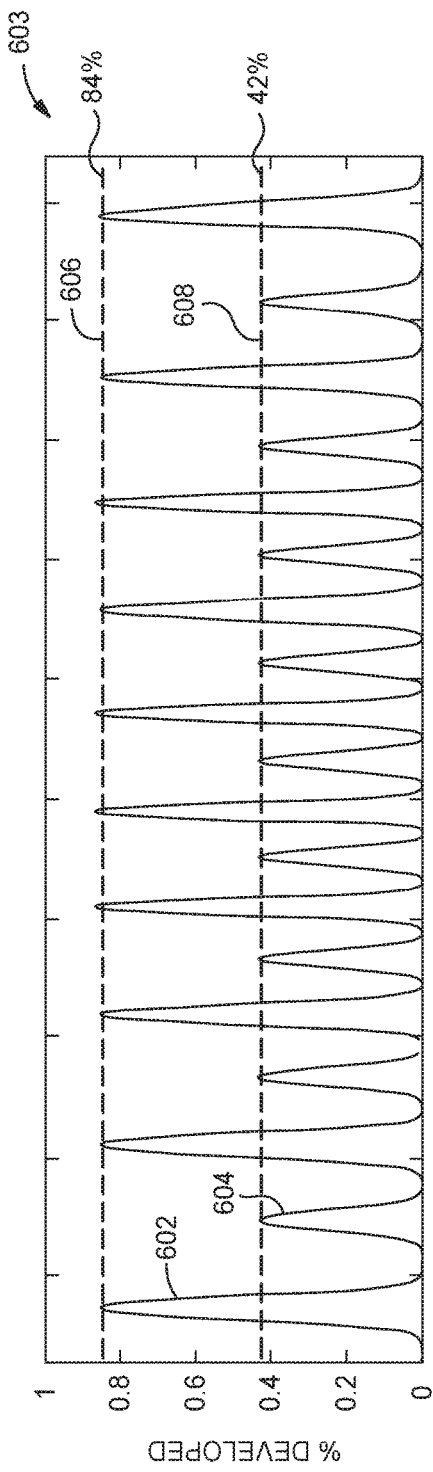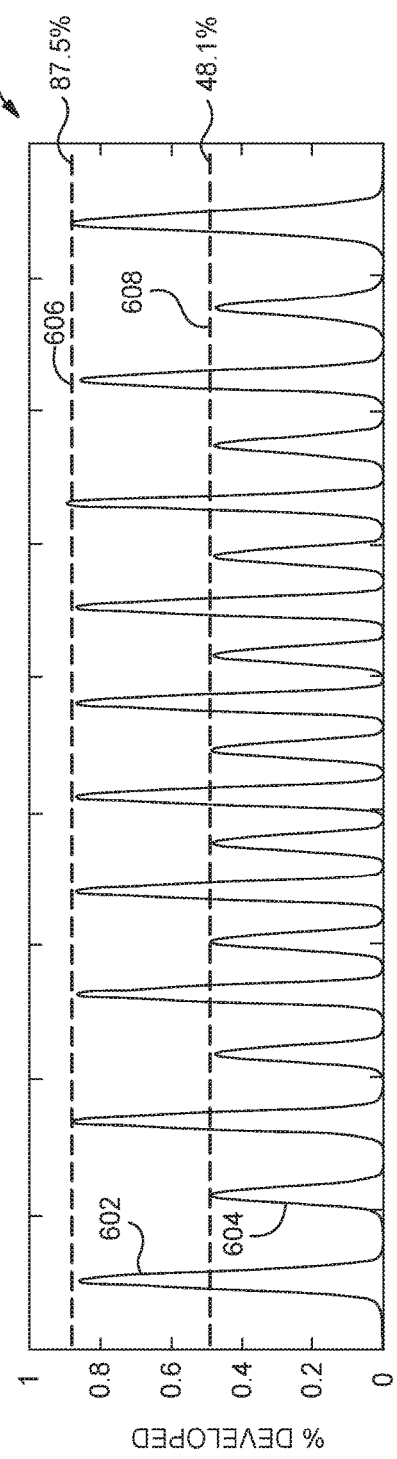

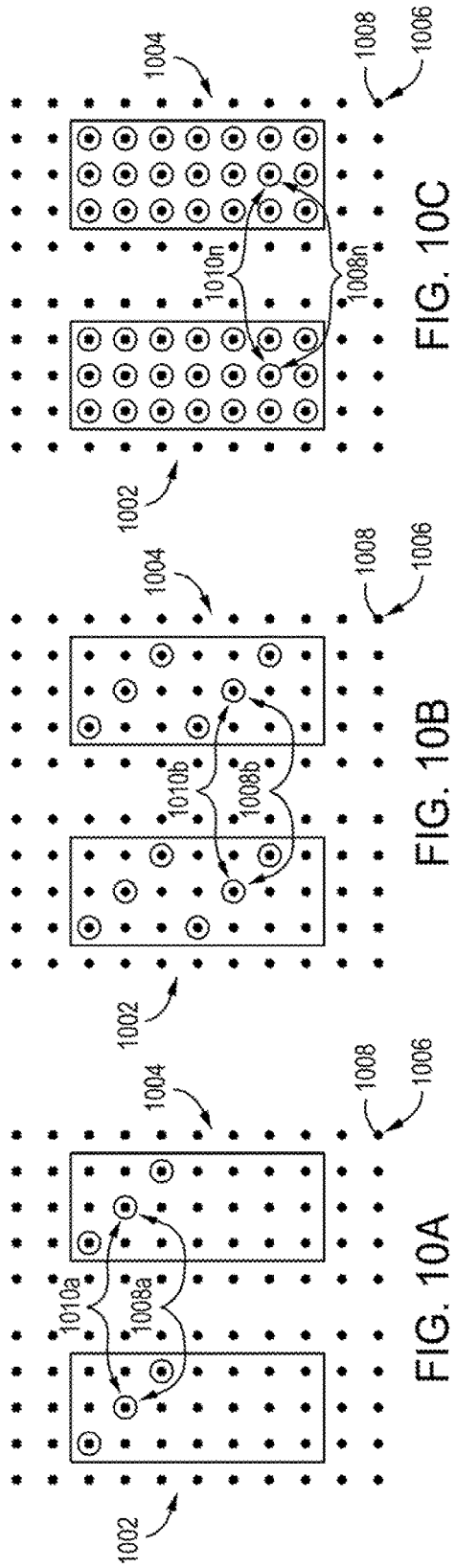
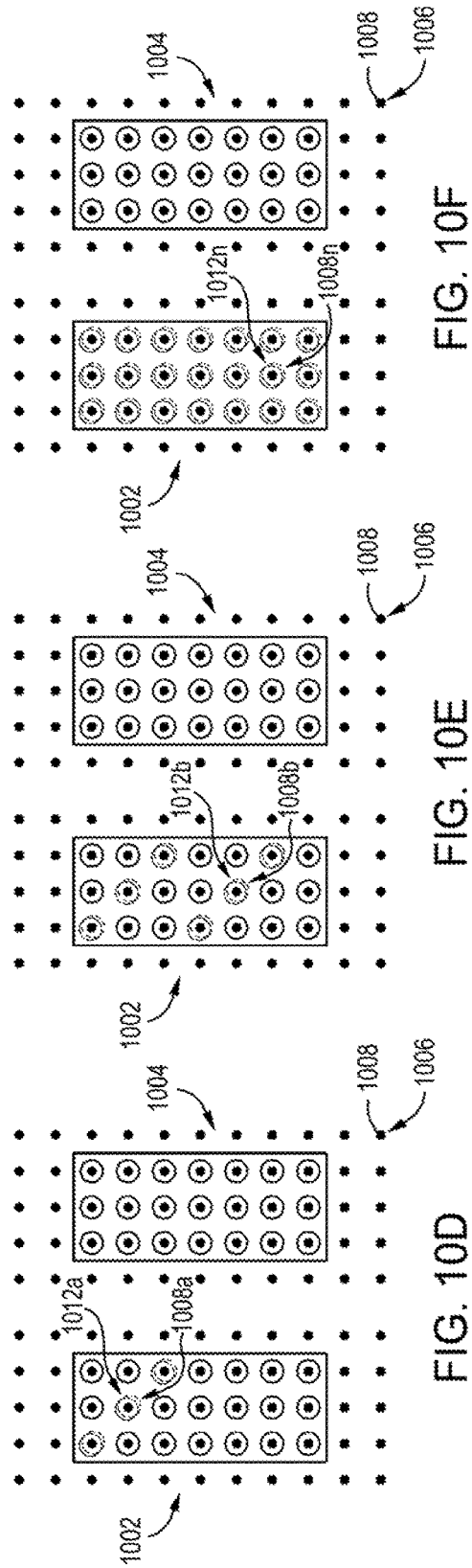

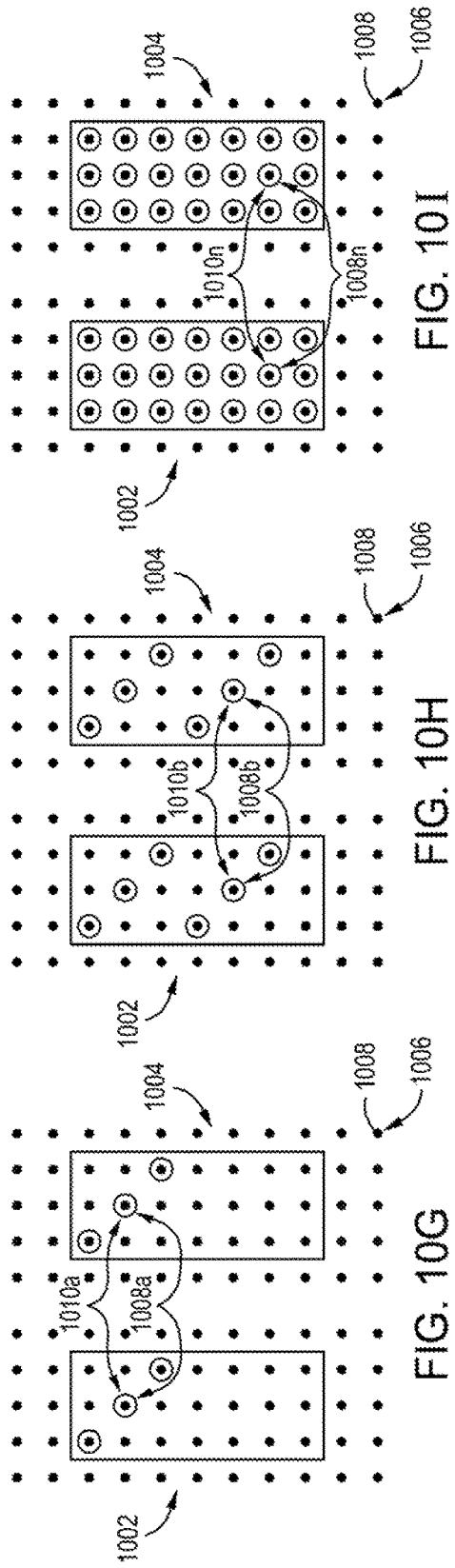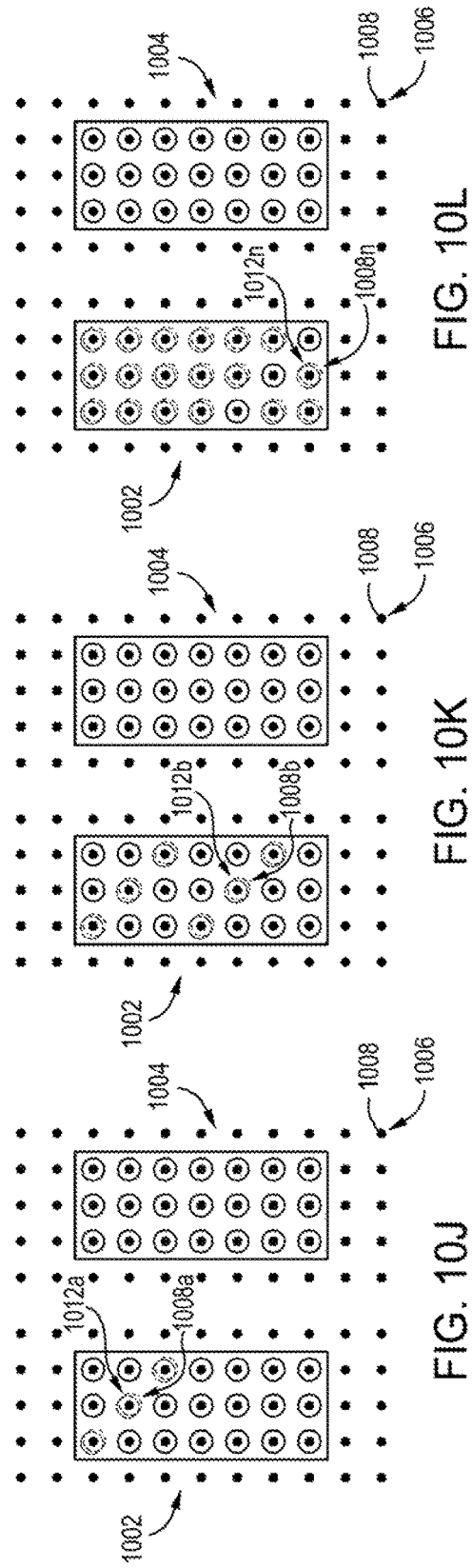

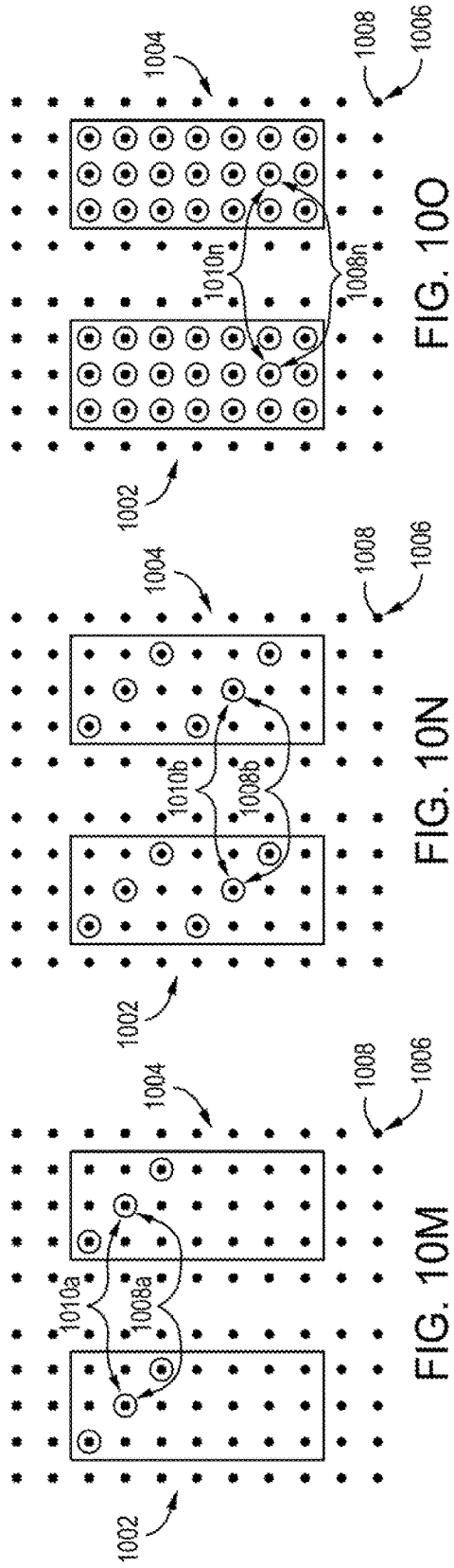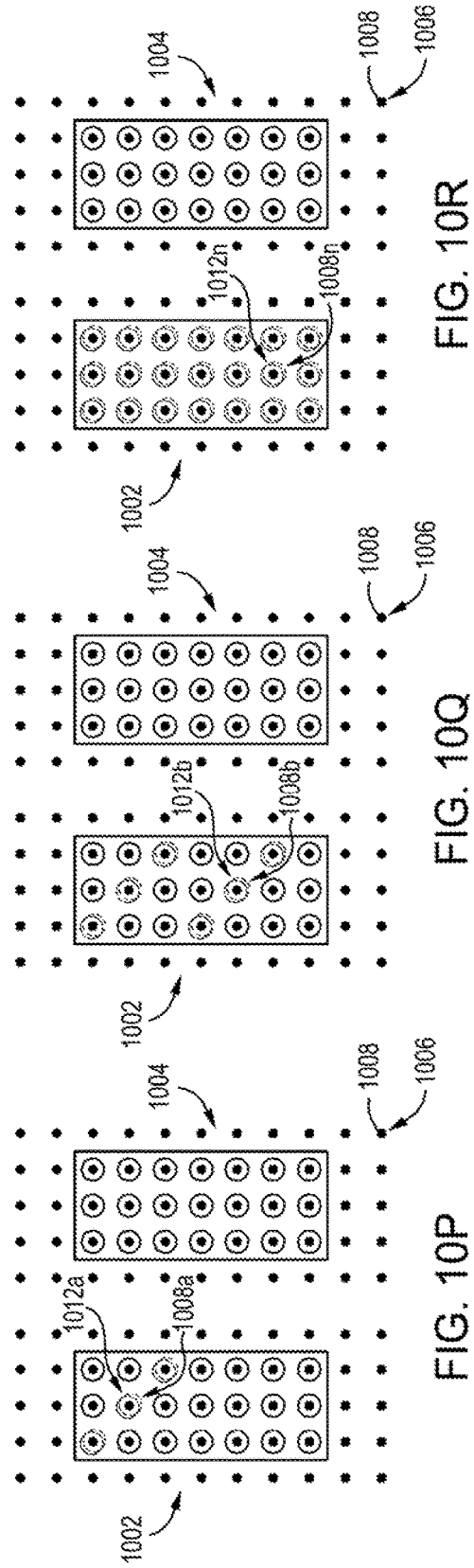

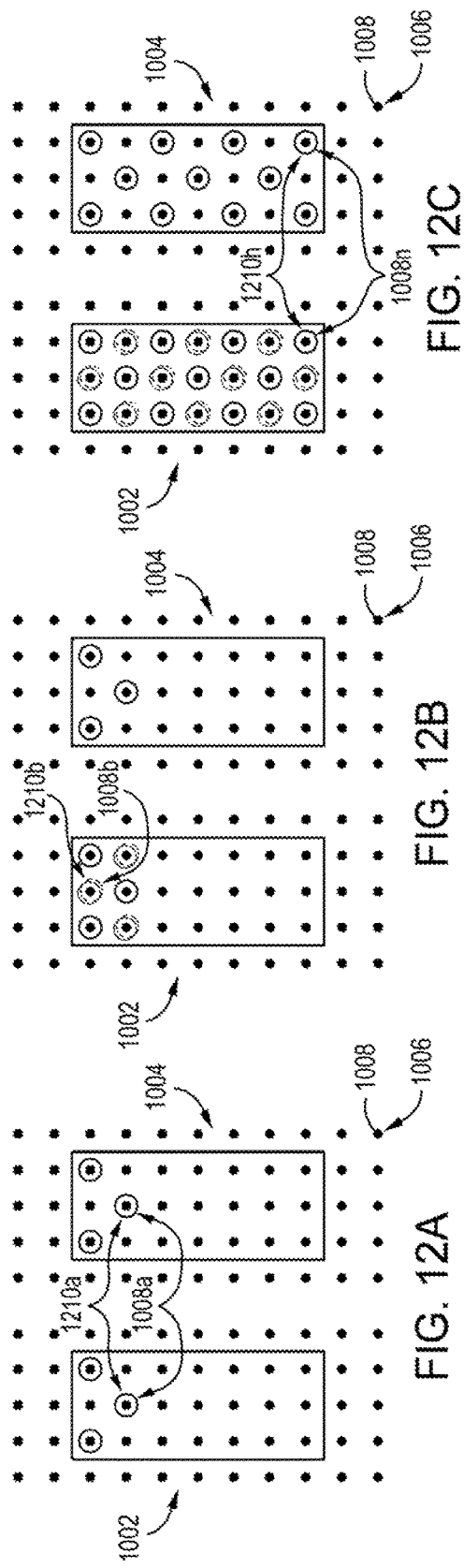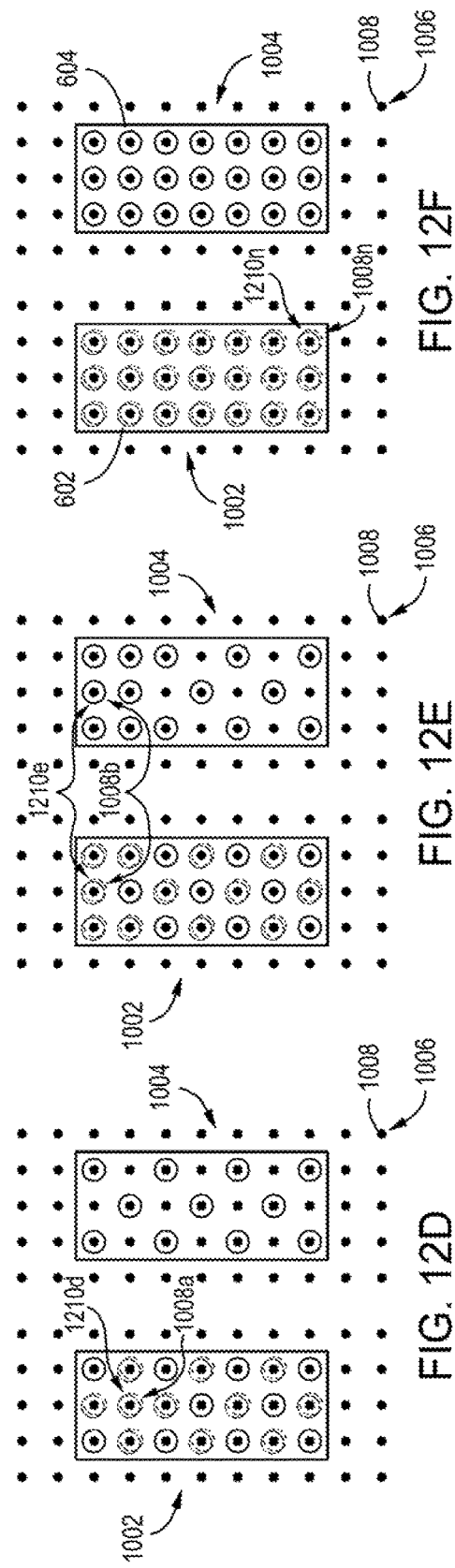

HALF TONE SCHEME FOR MASKLESS LITHOGRAPHY

BACKGROUND

Field

Embodiments of the present disclosure generally relate to lithography systems. More particularly, embodiments of the present disclosure relate to a system, a software application, and a method of a lithography process to write full tone portions and grey tone portions in a single pass.

Description of the Related Art

Photolithography is widely used in the manufacturing of semiconductor devices, such as for back-end processing of semiconductor devices, and display devices, such as liquid crystal displays (LCDs). For example, large area substrates are often utilized in the manufacture of LCDs. LCDs, or flat panel displays, are commonly used for active matrix displays, such as computers, touch panel devices, personal digital assistants (PDAs), cell phones, television monitors, and the like. Generally, flat panel displays include a layer of liquid crystal material as a phase change material at each pixel, sandwiched between two plates. When power from a power supply is applied across or through the liquid crystal material, an amount of light passing through the liquid crystal material is controlled, i.e., selectively modulated, at the pixel locations enabling images to be generated on the display.

With a conventional lithography system, to write a pattern of a plurality of full tone portions with a full tone dose and a plurality of grey tone portions with a grey tone dose into a photoresist disposed over a substrate, multiple passes of the substrate under the writable area of the lithography system are required. Multiple passes of the substrate under the writable area digital lithography system decreases throughput.

Accordingly, what is needed in the art is a system, a software application, and a method of a lithography process to write full tone portions and grey tone portions in a single pass.

SUMMARY

In one embodiment, a system is provided. The system includes a slab, a moveable stage disposable over the slab. The stage is configured to support a substrate having a photoresist disposed thereon and an encoder is coupled to the stage configured to provide a position of the substrate to a controller configured to provide mask pattern data to a lithography system. The mask pattern data has a plurality of full tone exposure polygons and a plurality of grey tone exposure polygons. A lithography system support is coupled to the slab having an opening to allow the stage to pass thereunder. The lithography system has a processing unit with a plurality of image projection systems that receive the mask pattern data. Each image projection system includes a spatial light modulator with a plurality of spatial light modulator pixels to project a multiplicity of shots. The controller is configured to divide the plurality of spatial light modulator pixels spatially by at least a grey tone group of spatial light modulator pixels and a full tone group of spatial light modulator pixels. When divided by the controller, the grey tone group of spatial light modulator pixels is operable to project a first number of the multiplicity of shots to the plurality of full tone exposure polygons and the plurality of grey tone exposure polygons. When divided by the controller, the full tone group of spatial light modulator pixels is operable to project a second number of the multiplicity of shots to the plurality of full tone exposure polygons.

In another embodiment, a non-transitory computer-readable medium is provided. The computer-readable medium storing instructions that, when executed by a processor, cause a computer system to perform the steps of providing a mask pattern data having a plurality of exposure polygons to a processing unit of a lithography system, projecting at least a first number of a multiplicity of shots to the plurality of full tone exposure polygons and the plurality of grey tone exposure polygons with a grey tone group of spatial light modulator pixels, and projecting at least a second number of the multiplicity of shots to the plurality of full tone exposure polygons with a full tone group of spatial light modulator pixels in a single scan of a substrate having a photoresist disposed thereon under the plurality of image projection systems. The processing unit has the plurality of image projection systems that receive the mask pattern data. The mask pattern data has a plurality of full tone exposure polygons and a plurality of grey tone exposure polygons.

In yet another embodiment, a method is provided. The method includes providing a mask pattern data having a plurality of exposure polygons to a processing unit of a lithography system. The processing unit has a plurality of image projection systems that receive the mask pattern data. The mask pattern data has a plurality of full tone exposure polygons and a plurality of grey tone exposure polygons. In a single scan of a substrate having a photoresist disposed thereon under the plurality of image projection systems, the method includes projecting at least a first number of a multiplicity of shots to the plurality of full tone exposure polygons and the plurality of grey tone exposure polygons with a grey tone group of spatial light modulator pixels, and projecting at least a second number of the multiplicity of shots to the plurality of full tone exposure polygons with a full tone group of spatial light modulator pixels.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 6B-6D are cross-sectional views of an exposure of a photoresist at a cross section according to one embodiment.

FIGS. 10A-10S are schematic, plane views of full tone exposure polygon and grey tone exposure polygons during methods of a lithography process according to embodiments.

FIGS. 12A-12F are schematic, plane views of a full tone exposure polygon and a grey tone exposure polygon during a method of a lithography process according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a system, a software application, and a method of a lithography process, such as a digital lithography process, to write full tone portions and grey tone portions in a single pass. One embodiment of the system includes a controller configured to provide mask pattern data to a lithography system. The mask pattern data has a plurality of full tone exposure polygons and a plurality of grey tone exposure polygons. The lithography system has a processing unit with a plurality of image projection systems that receive the mask pattern data. Each image projection system includes a spatial light modulator with a plurality of spatial light modulator pixels to project a multiplicity of shots. The controller is configured to divide the plurality of spatial light modulator pixels spatially by at least a grey tone group of spatial light modulator pixels and a full tone group of spatial light modulator pixels. When divided by the controller, the grey tone group of spatial light modulator pixels is operable to project a first number of the multiplicity of shots to the plurality of full tone exposure polygons and the plurality of grey tone exposure polygons. When divided by the controller, the full tone group of spatial light modulator pixels is operable to project a second number of the multiplicity of shots to the plurality of full tone exposure polygons.

Figure 1:
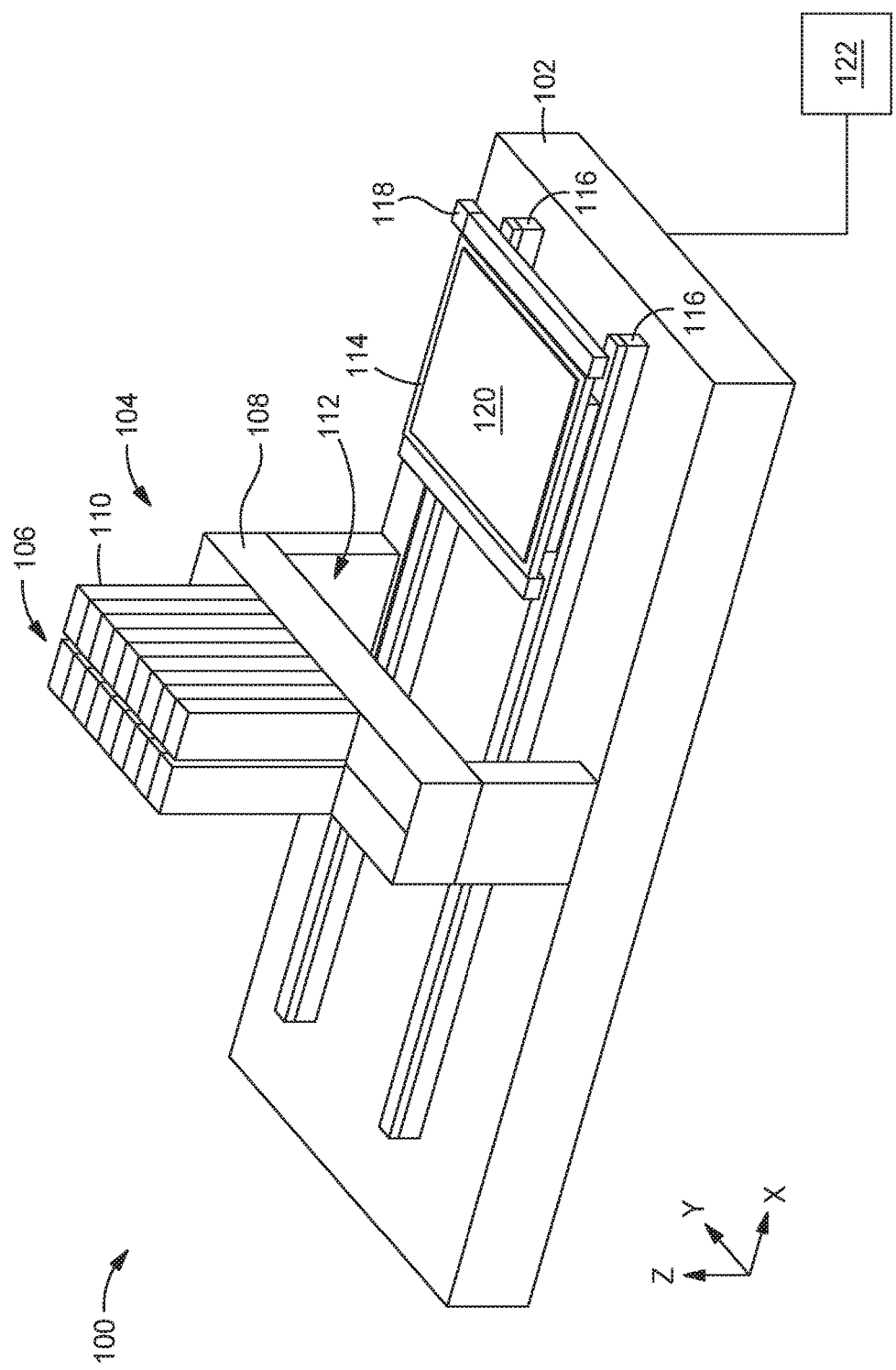
FIG. 1 is a perspective view of a system according to one embodiment.

FIG. 1 is a perspective view of a system 100, such as a digital lithography system, that may benefit from embodiments described herein. The system 100 includes a stage 114 and a processing apparatus 104. The stage 114 is supported by a pair of tracks 116 disposed on a slab 102. A substrate 120 is supported by the stage 114. The stage 114 is supported by a pair of tracks 116 disposed on the slab 102. The stage 114 moves along the pair of tracks 116 in the X direction as indicated by the coordinate system shown in FIG. 1. In one embodiment, which can be combined with other embodiments described herein, the pair of tracks 116 is a pair of parallel magnetic channels. As shown, each track of the pair of tracks 116 extends in a straight line path. An encoder 118 is coupled to the stage 114 in order to provide information of the location of the stage 114 to a controller 122.

The controller 122 is generally designed to facilitate the control and automation of the processing techniques described herein. The controller 122 may be coupled to or in communication with the processing apparatus 104, the stage 114, and the encoder 118. The processing apparatus 104 and the encoder 118 may provide information to the controller 122 regarding the substrate processing and the substrate aligning. For example, the processing apparatus 104 may provide information to the controller 122 to alert the controller 122 that substrate processing has been completed. The controller 122 facilitates the control and automation of methods of a lithography process to write full tone portions and grey tone portions in a single pass. A program (or computer instructions), which may be referred to as an imaging program, readable by the controller 122, determines which tasks are performable on a substrate 120. The program includes a mask pattern data and code to monitor and control the processing time and substrate position. The mask pattern data corresponding to a pattern to be written into the photoresist using the electromagnetic radiation.

The substrate 120 comprises any suitable material, for example, glass, which is used as part of a flat panel display. In other embodiments, which can be combined with other embodiments described herein, the substrate 120 is made of other materials capable of being used as a part of the flat panel display. The substrate 120 has a film layer to be patterned formed thereon, such as by pattern etching thereof, and a photoresist layer formed on the film layer to be patterned, which is sensitive to electromagnetic radiation, for example UV or deep UV "light". A positive photoresist includes portions of the photoresist, when exposed to radiation, are respectively soluble to a photoresist developer applied to the photoresist after the pattern is written into the photoresist using the electromagnetic radiation. A negative photoresist includes portions of the photoresist, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. Examples of photoresists include, but are not limited to, at least one of diazonaphthoquinone, a phenol formaldehyde resin, poly(methyl methacrylate), poly(methyl glutarimide), and SU-8. After exposure of the photoresist to the electromagnetic radiation, the resist is developed to leave a patterned photoresist on the underlying film layer. Then, using the patterned photoresist, the underlying thin film is pattern etched through the openings in the photoresist to form a portion of the electronic circuitry of the display panel.

The processing apparatus 104 includes a support 108 and a processing unit 106. The processing apparatus 104 straddles the pair of tracks 116 and is disposed on the slab 102, and thereby includes an opening 112 for the pair of tracks 116 and the stage 114 to pass under the processing unit 106. The processing unit 106 is supported over the slab 102 by a support 108. In one embodiment, which can be combined with other embodiments described herein, the processing unit 106 is a pattern generator configured to expose photoresist in a photolithography process. In some embodiments, which can be combined with other embodiments described herein, the pattern generator is configured to perform a maskless lithography process. The processing unit 106 includes a plurality of image projection systems. One example of an image projection system is show in FIG. 2A. In one embodiment, which can be combined with other embodiments described herein, the processing unit 106 contains as many as 84 image projection systems. Each image projection system is disposed in a case 110. The processing unit 106 is useful to perform maskless direct pattern writing to photoresist or other electromagnetic radiation sensitive material.

Figure 2B:
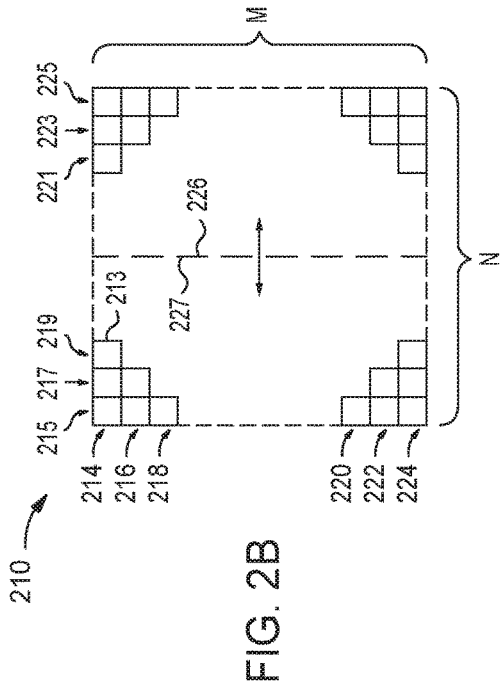
FIG. 2B and FIG. 2C are schematic views of a spatial light modulator according to one embodiment.
Figure 2C:
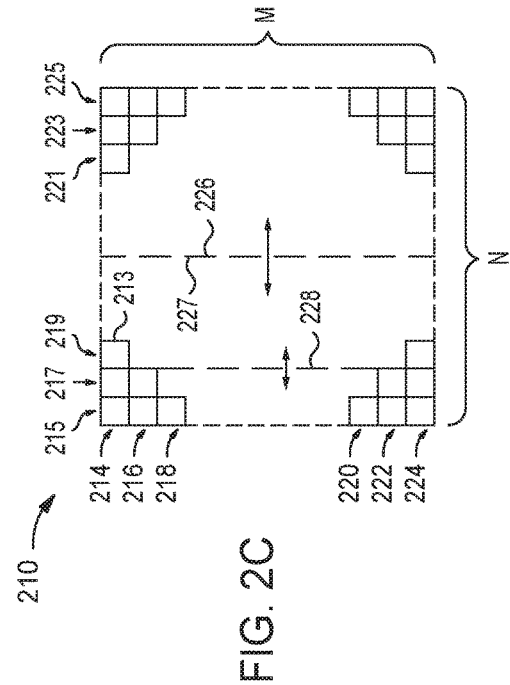
Figure 2A:
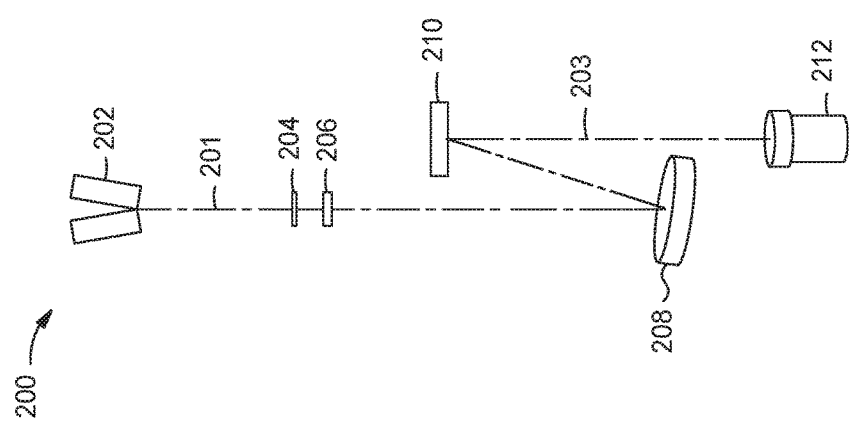
FIG. 2A is a schematic, cross-sectional view of an image projection system according to one embodiment.

FIG. 2A is a schematic, cross-sectional view of an image projection system 200 that may be used in system 100. The image projection system 200 includes a spatial light modulator 210 and projection optics 212. The components of the image projection system 200 vary depending on the spatial light modulator 210 being used. The spatial light modulator 210 includes an array of electrically addressable elements. The electrically addressable elements include, but are not limited to, digital micromirrors, liquid crystal displays (LCDs), liquid crystal over silicon (LCoS) devices, ferroelectric liquid crystal on silicon (FLCoS) devices, and microshutters. The spatial light modulator 210 includes a plurality of spatial light modulator pixels. Each spatial light modulator pixel of the plurality of spatial light modulator pixels are individually controllable and are configured to project a write beam corresponding to a pixel of a plurality of pixels. The compilation of plurality of pixels form of the pattern written into the photoresist, referred to herein as the mask pattern. The projection optics 212 includes projection lenses, for example 10× objective lenses, used to project the light onto the substrate 120. In operation, based on the mask pattern data provided to the spatial light modulator 210 by the controller 122, each spatial light modular pixel of the plurality of spatial light modulator pixels is at an "on" position or "off" position. Each spatial light modular pixel at an "on" position forms a write beam that the projection optics 212 then projects the write beam to the photoresist layer surface of the substrate 120 to form a pixel of the mask pattern.

In one embodiment, which can be combined with other embodiments described herein, the spatial light modulator 210 is a DMD. The image projection system 200 includes a light source 202, an aperture 204, a lens 206, a frustrated prism assembly 208, the DMD, and the projection optics 212. The DMD includes a plurality of mirrors, i.e, the plurality of spatial light modulator pixels. Each mirror of the plurality of mirrors corresponds to a pixel that may correspond to a pixel of the mask pattern. In some embodiments, which can be combined with other embodiments described herein, the DMD includes more than about 4,000,000 mirrors. The light source 202 is any suitable light source, such as a light emitting diode (LED) or a laser, capable of producing a light having a predetermined wavelength. In one embodiment, which can be combined with other embodiments described herein, the predetermined wavelength is in the blue or near ultraviolet (UV) range, such as less than about 450 nm. The frustrated prism assembly 208 includes a plurality of reflective surfaces. In operation, a light beam 201 having is produced by the light source 202. The light beam 201 is reflected to the DMD by the frustrated prism assembly 208. When the light beam 201 reaches the mirrors of the DMD, each mirror at "on" position reflect the light beam 201, i.e., forms a write beam, also known as a "shot", that the projection optics 212 then projects to shot the photoresist layer surface of the substrate 120. The plurality of write beams 203, also known as a plurality of shots, forms a plurality of pixels of the mask pattern.

FIG. 2B and FIG. 2C are schematic views of the spatial light modulator 210 that is a DMD. The plurality of mirrors 213, also known as the plurality of spatial light modulator pixels, is arranged in a grid having M rows and N columns. In FIG. 2B, rows 214, 216, 218, 220, 222, 224, and columns 215, 217, 219, 221, 223, and 225 are shown. In a method 700 of a lithography process to write full tone portions and grey tone portions in a single pass, the controller 122, as shown in FIG. 2B, divides the one of the N columns and M rows of mirrors 213 into a grey tone group 226 and a full tone group 227. In embodiments of the methods 700, 800, 900, described herein, the division of the one of the N columns and M rows of mirrors 213 is dependent on movement of the stage 114. When the movement of the stage 114 is substantially perpendicular to the N columns, the N columns are divided by the controller 122. When the movement of the stage 114 is substantially perpendicular to the M rows, the M rows are divided by the controller 122. When the movement of the stage 114 is neither substantially perpendicular to one of the N columns and M rows, arrays of the grid having M rows and N columns are divided by the controller 122. In the embodiments described below, the movement of the stage 114 is substantially perpendicular to the N columns, and thus the N columns are divided by the controller 122. However, the embodiments described below of the methods 700, 800, 900, may be performed with the movement of the stage 114 substantially perpendicular to N rows by dividing the N rows, and with the movement of the stage 114 neither substantially perpendicular to one of the N columns and M rows by dividing arrays of the grid having M rows and N columns. In one embodiment of the method 700, which can be combined with other embodiments described herein, the grey tone group 226 and the full tone group 227 has a same number of columns. In a method 800 of a lithography process to write full tone portions and grey tone portions in a single pass, the controller 122, as shown in FIG. 2B, divides the N columns of mirrors 213 into a grey tone group 226 and a full tone group 227 having a different number of columns. In a method 900 of a lithography process to write full tone portions and grey tone portions in a single pass, the controller 122, as shown in FIG. 2C, divides the N columns of mirrors 213 into a grey tone group 226, a full tone group 227, and a remaining group 228. In one embodiment, which can be combined with other embodiments described herein, the grey tone group 226 and the full tone group 227 have a same number of columns. In another embodiment, which can be combined with other embodiments described herein, the grey tone group 226 and the full tone group 227 have a different number of columns.

Figure 3:
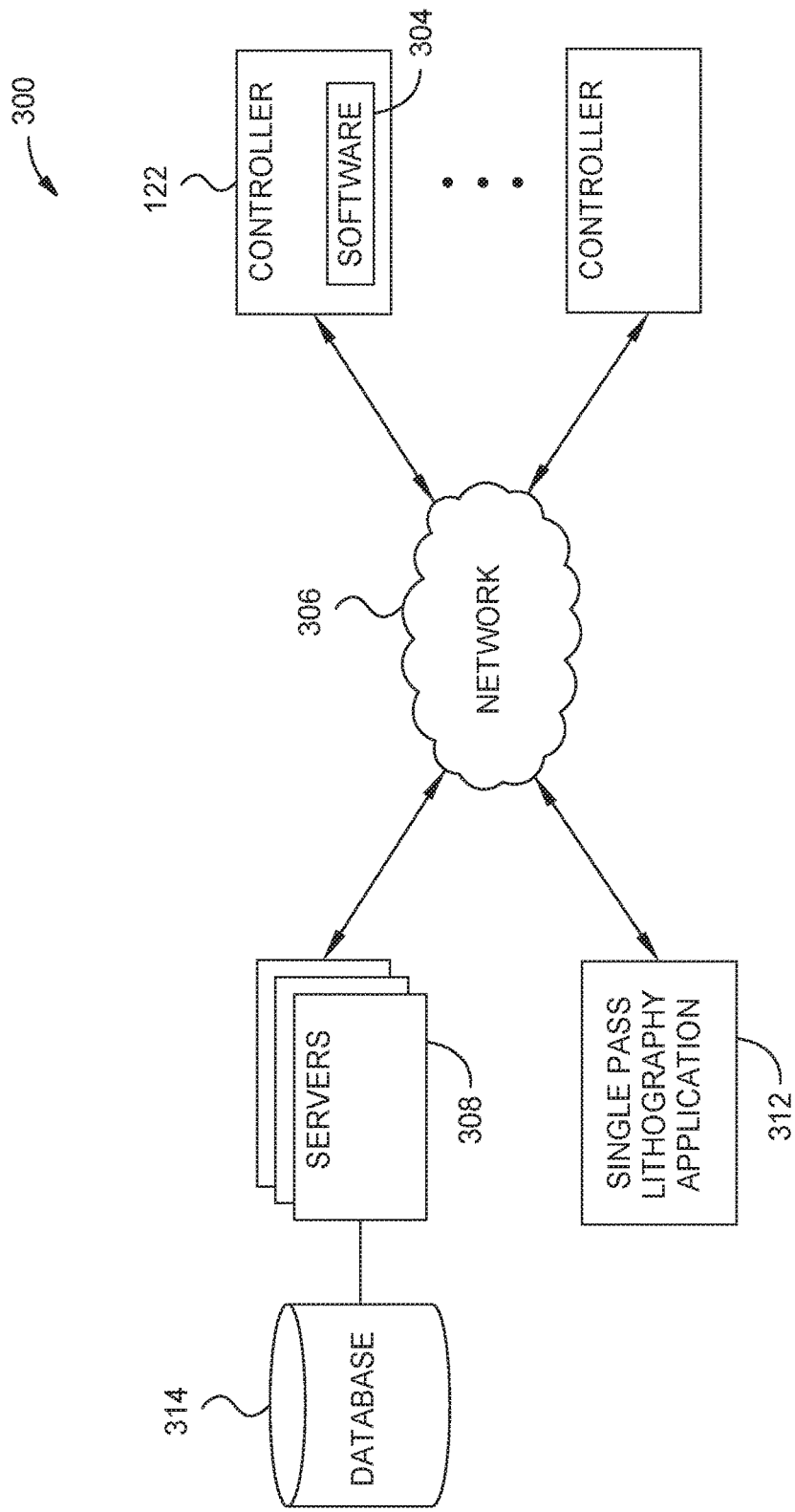
FIG. 3 is a schematic view of a computing system according to one embodiment.

FIG. 3 is a schematic view of a computing system 300 configured for writing full tone portions and grey tone portions in a single pass in which embodiments of the disclosure may be practiced. As shown in FIG. 3, the computing system 300 may include a plurality of servers 308, a single pass lithography application 312, and a plurality of controllers (i.e., computers, personal computers, mobile/wireless devices) 122 (only two of which are shown for clarity), each connected to a communications network 306 (for example, the Internet). The servers 308 may communicate with the database 314 via a local connection (for example, a Storage Area Network (SAN) or Network Attached Storage (NAS)) or over the Internet. The servers 308 are configured to either directly access data included in the database 314 or to interface with a database manager that is configured to manage data included within the database 314.

Figure 4:
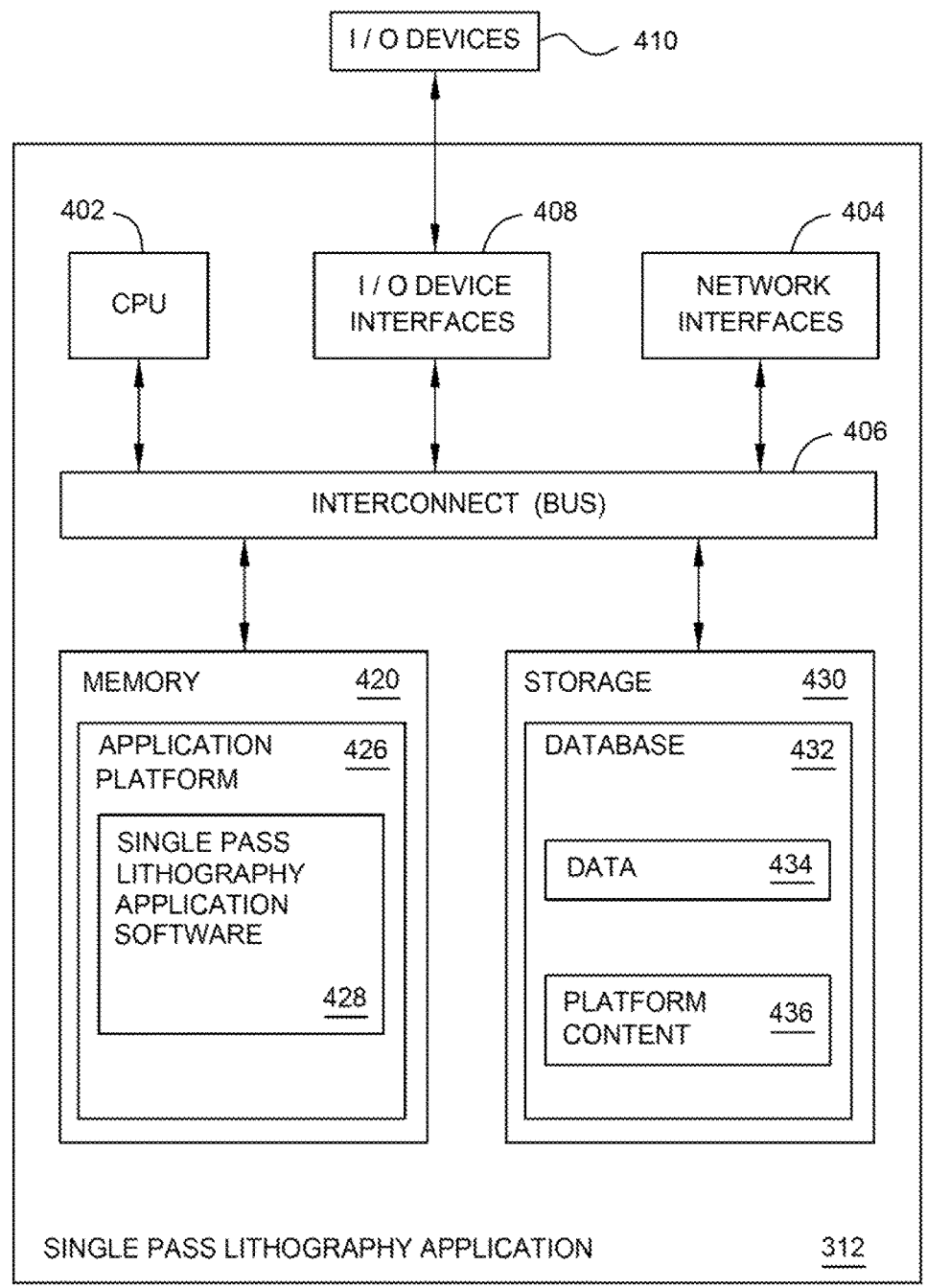
FIG. 4 is a schematic view of the single pass lithography application according to one embodiment.

Each controller 122 may include conventional components of a computing device, for example, a processor, system memory, a hard disk drive, a battery, input devices such as a mouse and a keyboard, and/or output devices such as a monitor or graphical user interface, and/or a combination input/output device such as a touchscreen which not only receives input but also displays output. Each server 308 and the single pass lithography application 312 may include a processor and a system memory (not shown), and may be configured to manage content stored in database 314 using, for example, relational database software and/or a file system. The I/O device interfaces 408, as shown in FIG. 4, may be programmed to communicate with one another, the controllers 122, and the single pass lithography application 312 using a network protocol such as, for example, the TCP/IP protocol. The single pass lithography application 312 may communicate directly with the controllers 122 through the communications network 306. The controllers 122 are programmed to execute software 304, such as programs and/or other software applications, and access applications managed by servers 308.

In the embodiments described below, users may respectively operate the controllers 122 that may be connected to the servers 308 over the communications network 306. Pages, images, data, documents, and the like may be displayed to a user via the controllers 122. Information and images may be displayed through a display device and/or a graphical user interface in communication with the controller 122.

It is noted that the controller 122 may be a personal computer, laptop mobile computing device, smart phone, video game console, home digital media player, network-connected television, set top box, and/or other computing devices having components suitable for communicating with the communications network 306 and/or the required applications or software. The controller 122 may also execute other software applications configured to receive content and information from the single pass lithography application 312.

FIG. 4 is a schematic view of the single pass lithography application 312. The single pass lithography application 312 includes, without limitation, a central processing unit (CPU) 402, a network interface 404, memory 420, and storage 430 communicating via an interconnect 406. The single pass lithography application 312 may also include I/O device interfaces 408 connecting I/O devices 410 (for example, keyboard, video, mouse, audio, touchscreen, etc.). The single pass lithography application 312 may further include the network interface 504 (shown in FIG. 5) configured to transmit data via the data communications network.

The CPU 402 retrieves and executes programming instructions stored in the memory 420 and generally controls and coordinates operations of other system components. Similarly, the CPU 402 stores and retrieves application data residing in the memory 420. The CPU 402 is included to be representative of a single CPU, multiple CPU's, a single CPU having multiple processing cores, and the like. The interconnect 406 is used to transmit programming instructions and application data between the CPU 402, I/O device interfaces 408, storage 430, network interfaces 404, and memory 420.

The memory 420 is generally included to be representative of a random access memory and, in operation, stores software applications and data for use by the CPU 402. Although shown as a single unit, the storage 430 may be a combination of fixed and/or removable storage devices, such as fixed disk drives, floppy disk drives, hard disk drives, flash memory storage drives, tape drives, removable memory cards, CD-ROM, DVD-ROM, Blu-Ray, HD-DVD, optical storage, network attached storage (NAS), cloud storage, or a storage area-network (SAN) configured to store non-volatile data.

The memory 420 may store instructions and logic for executing an application platform 426 which may include single pass lithography application software 428. The storage 430 may include a database 432 configured to store data 434 and associated application platform content 436. The database 432 may be any type of storage device.

Network computers are another type of computer system that can be used in conjunction with the disclosures provided herein. Network computers do not usually include a hard disk or other mass storage, and the executable programs are loaded from a network connection into the memory 420 for execution by the CPU 502 (shown in FIG. 5). A typical computer system will usually include at least a processor, memory, and an interconnect coupling the memory to the processor.

Figure 5:
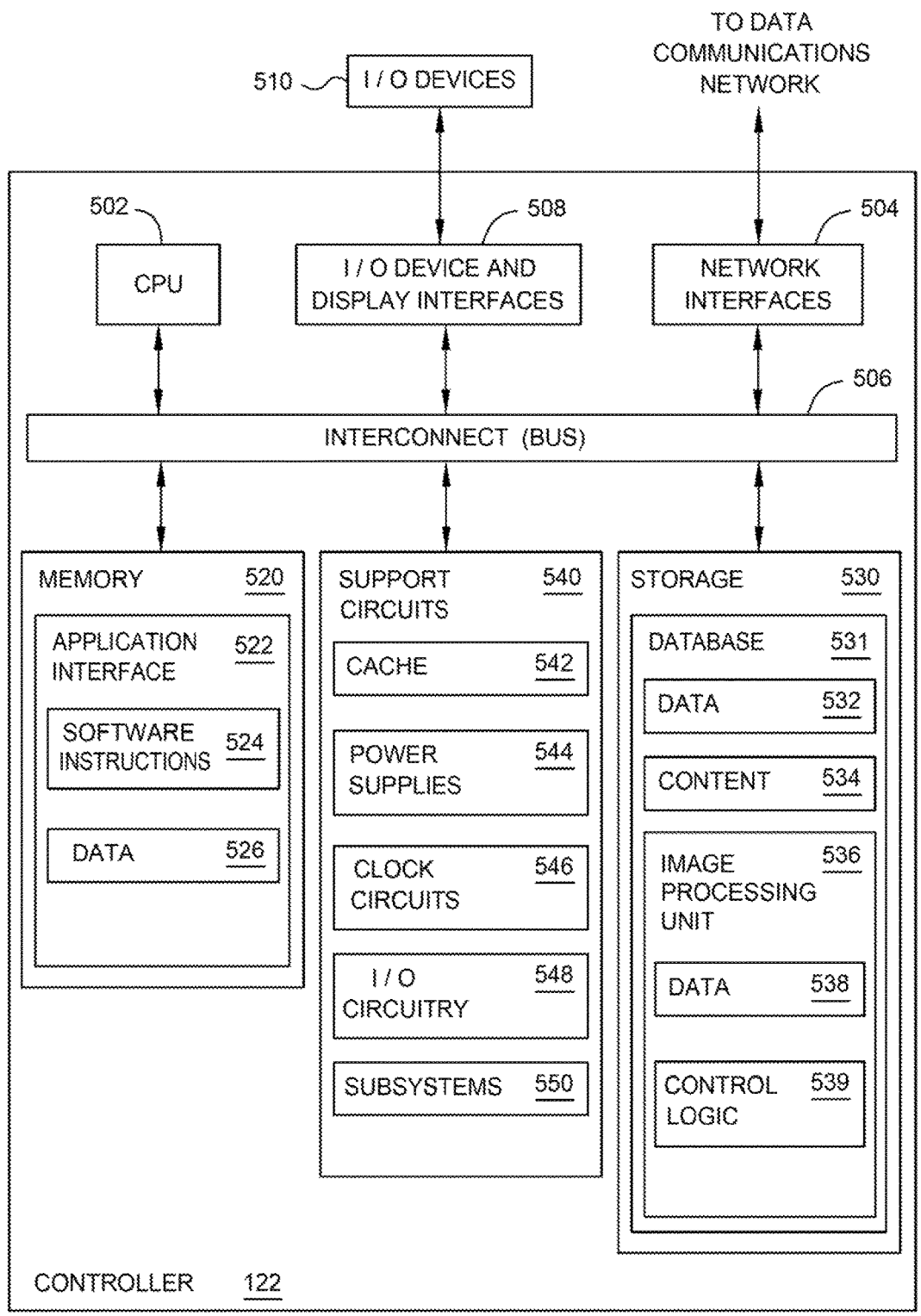
FIG. 5 is a schematic view of a controller according to one embodiment.

FIG. 5 is a schematic view of a controller 122 used to access the single pass lithography application 312 and retrieve or display data associated with the application platform 426. The controller 122 may include, without limitation, a central processing unit (CPU) 502, a network interface 504, an interconnect 506, a memory 520, storage 530, and support circuits 540. The controller 122 may also include an I/O device interface 508 connecting I/O devices 510 (for example, keyboard, display, touchscreen, and mouse devices) to the controller 122.

Like CPU 402, CPU 502 is included to be representative of a single CPU, multiple CPU's, a single CPU having multiple processing cores, etc., and the memory 520 is generally included to be representative of a random access memory. The interconnect 506 may be used to transmit programming instructions and application data between the CPU 502, I/O device interfaces 508, storage 530, network interface 504, and memory 520. The network interface 504 may be configured to transmit data via the communications network 306, for example, to transfer content from the single pass lithography application 312. Storage 430, such as a hard disk drive or solid-state storage drive (SSD), may store non-volatile data. The storage 530 may contain a database 531. The database 531 may contain data 532, other content 534, and an image process unit 536 having data 538 and control logic 539. Illustratively, the memory 520 may include an application interface 522, which itself may display software instructions 524, and/or store or display data 526. The application interface 522 may provide one or more software applications which allow the controller to access data and other content hosted by the single pass lithography application 312.

As shown in FIG. 1, the system 100 includes the controller 122. The controller 122 includes a central processing unit (CPU) 502, memory 520, and support circuits 540 (or I/O 508). The CPU 502 may be one of any form of computer processors that are used in industrial settings for controlling various processes and hardware (e.g., pattern generators, motors, and other hardware) and monitor the processes (e.g., processing time and substrate position). The memory 520, as shown in FIG. 5, is connected to the CPU 502, and may be one or more of a readily available memory, such as random access memory (RAM), read only memory (ROM), floppy disk, hard disk, or any other form of digital storage, local or remote. Software instructions and data can be coded and stored within the memory for instructing the CPU 502. The support circuits 540 are also connected to the CPU 502 for supporting the processor in a conventional manner. The support circuits 540 may include conventional cache 542, power supplies 544, clock circuits 546, input/output circuitry 548, subsystems 550, and the like. A program (or computer instructions) readable by the controller 122 determines which tasks are performable on a substrate 120. The program may be software readable by the controller 122 and may include code to monitor and control, for example, the processing time and substrate position.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present example also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, read-only memories (ROMs), random access memories (RAMs), EPROMs, EEPROMs, flash memory, magnetic or optical cards, any type of disk including floppy disks, optical disks, CD-ROMs, and magnetic-optical disks, or any type of media suitable for storing electronic instructions, and each coupled to a computer system interconnect.

The algorithms and displays presented herein are not inherently related to any particular computer or other apparatus. Various general purpose systems may be used with programs in accordance with the teachings herein, or it may prove convenient to construct a more specialized apparatus to perform the required method operations. The structure for a variety of these systems will appear from the description above. In addition, the present examples are not described with reference to any particular programming language, and various examples may thus be implemented using a variety of programming languages.

As described in greater detail within, embodiments of the disclosure relate to a lithography application relating to the ability to apply mask pattern data 610 to a substrate 120 in a single pass lithography process is disclosed. The embodiments described herein relate to a software application platform. The software application platform includes methods of writing full tone portions and grey tone portions in a single pass.

Figure 6A:
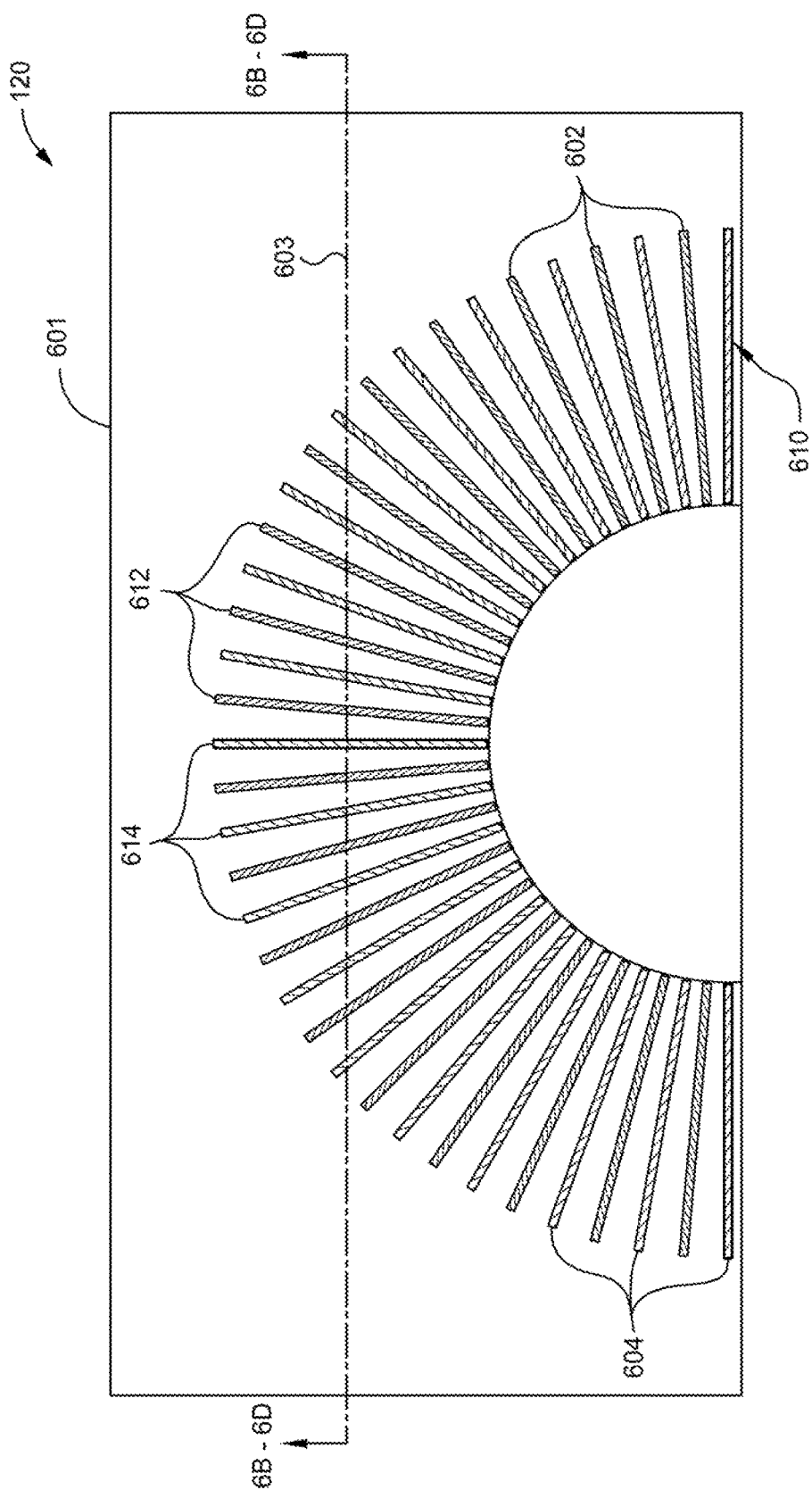
FIG. 6A is a schematic, plane view of a substrate after a lithography process according to one embodiment.

FIG. 6A is a schematic, plane view of the substrate 120 after a lithography process. A plurality of full tone portions 602 exposed to a full tone dose 606 of an intensity of light emitted from the light source 202 (shown in FIGS. 6B-6D) and a plurality of grey tone portions 604 exposed to a grey tone dose 608 of a intensity light emitted from the light source 202 (shown in FIGS. 6B-6D) are written into a photoresist 601. In one embodiment, which can be combined with other embodiments described herein, the intensity is about 10 mJ/cm$^2$ to about 200 mJ/cm$^2$. During the lithography process a mask pattern data 610 has a plurality of full tone exposure polygons 612 corresponding to the full tone portions 602 to be formed by the lithography process and a plurality of grey tone exposure polygons 614 corresponding to the grey tone portions 604 to be formed by the lithography process. The photoresist 601 is disposed over the substrate 120. In one embodiment, which can be combined with other embodiments described herein, the substrate 120 has a film layer to be patterned formed thereon, such as by pattern etching thereof, and the photoresist is disposed on the film layer to be patterned.

Figure 6D:
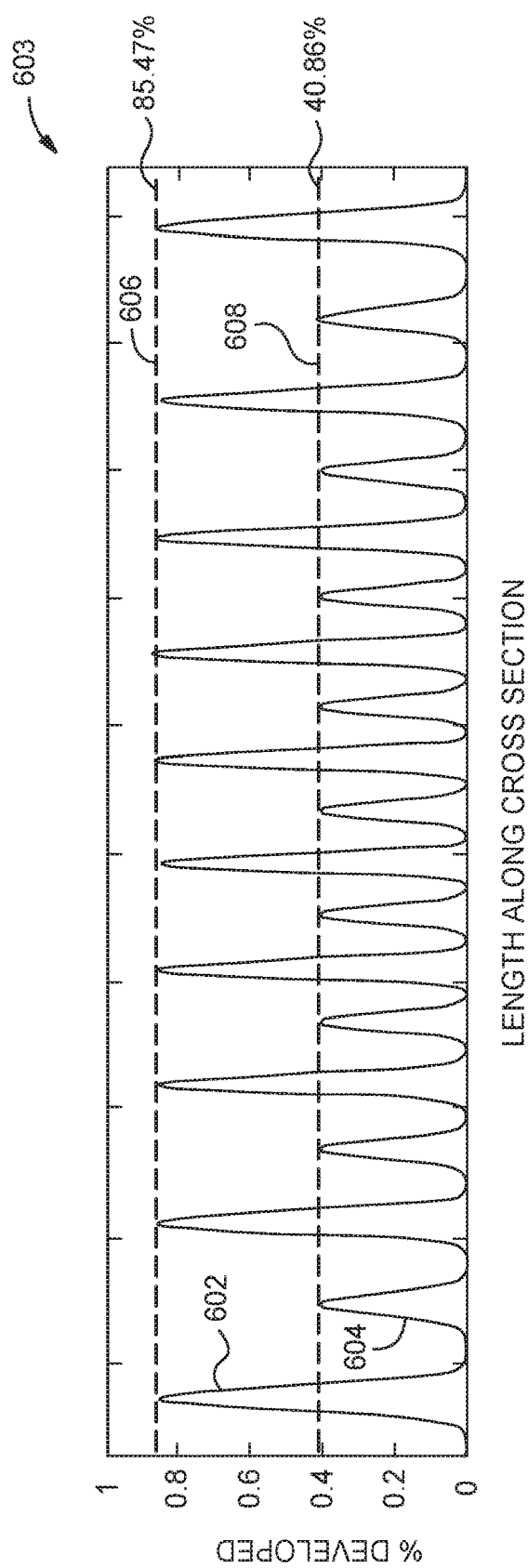

FIGS. 6B-6D are cross-sectional views of the exposure of the photoresist 601 at a cross section 603. The cross section 603 includes the plurality of full tone portions 602 exposed to the full tone dose 606 and the plurality of grey tone portions 604 exposed to a grey tone dose 608. The full tone dose 606 corresponds to a percentage of the photoresist 601 developed from exposing the plurality of full tone portions 602 to a full tone percentage of the intensity of light emitted from the light source 202. The grey tone dose 608 corresponds to a percentage of the photoresist 601 developed from exposing the plurality of grey tone portions 604 to a grey tone percentage of the intensity of light emitted from the light source 202. The width of each of the plurality of full tone portions 602 controls the full tone dose 606 from the full tone percentage of the intensity unless the width of one of the plurality of full tone portions 602 is greater than the width of one of the spatial light modulator pixels. For example, the width of one of the plurality of full tone portions 602 less than the width of one of the spatial light modulator pixels results in the full tone dose 606 of the full tone portion less than the full tone percentage. The width of one of the plurality of full tone portions 602 greater than or equal to the width of one of the spatial light modulator pixels results in the full tone dose 606 of the full tone portion equal to the full tone percentage. The width of each of the plurality of grey tone portions 604 controls the grey tone dose 608 from the grey tone percentage of the intensity unless the width of one of the plurality of grey tone portions 604 is greater than the width of one of the spatial light modulator pixels. For example, the width of one of the plurality of grey tone portions 604 less than the width of one of the spatial light modulator pixels results in the grey tone dose 608 of the grey tone portion less than the grey tone percentage. The width of one of the plurality of grey tone portions 604 greater than or equal to the width of one of the spatial light modulator pixels results in the grey tone dose 608 of the grey tone portion equal to the grey tone percentage. In one embodiment, which can be combined with other embodiments described herein, each of the plurality of full tone portions 602 and the plurality of grey tone portions 604 have the same width less than the width of the spatial light modulator pixel.

As shown in FIG. 6B and further described herein, the method 700 with the grey tone group 226 and the full tone group 227 having a same number of columns results in the grey tone percentage half of the full tone percentage. For example, the grey tone group 226 having 50% of the columns and the full tone portion having 50% of the columns results in the grey tone percentage of 50% and the full tone percentage of 100%. The grey tone dose 608 is 42% developed from the grey tone percentage of 50% of the intensity of light emitted from the light source 202 exposed to each of the plurality of grey tone portions 604 with the same width less than the width of the spatial light modulator pixel. The full tone dose 606 is 84% developed from the full tone percentage of 100% of the intensity of light emitted from the light source 202 exposed to each of the plurality of full tone portions 602 with the same width less than the width of the spatial light modulator pixel.

As shown in FIG. 6C and further described herein, the method 800 with the grey tone group 226 and the full tone group 227 having a different number of columns results in the grey tone percentage greater than half of than the full tone percentage. For example, the grey tone group 226 having 55% of the columns and the full tone portion having 45% of the columns results in the grey tone percentage of 55% and the full tone percentage of 95%. The grey tone dose 608 is 48.1% developed from the grey tone percentage of 55% of the intensity of light emitted from the light source 202 exposed to each of the plurality of grey tone portions 604 with the same width less than the width of the spatial light modulator pixel. The full tone dose 606 is 87.5% developed from the full tone percentage of 95% of the intensity of light emitted from the light source 202 exposed to each of the plurality of full tone portions 602 with the same width less than the width of the spatial light modulator pixel.

As shown in FIG. 6D and further described herein, the method 900 with the grey tone group 226, the full tone group 227, and the remaining group 228, with the grey tone group 226 and full tone group 227 having the same number of columns, results in the grey tone percentage less than half of the full tone percentage. For example, the grey tone group 226 having 48% of the columns, the full tone portion having 48% of the columns, and the remaining group 228 having 4% of the columns results in the grey tone percentage of 48% and the full tone percentage of 104%. The grey tone dose 608 is 40.86% developed from the grey tone percentage of 48% of the intensity of light emitted from the light source 202 exposed to each of the plurality of grey tone portions 604 with the same width less than the width of the spatial light modulator pixel. The full tone dose 606 is 85.47% developed from the full tone percentage of 104% of the intensity of light emitted from the light source 202 exposed to each of the plurality of full tone portions 602 with the same width less than the width of the spatial light modulator pixel.

Figure 7:
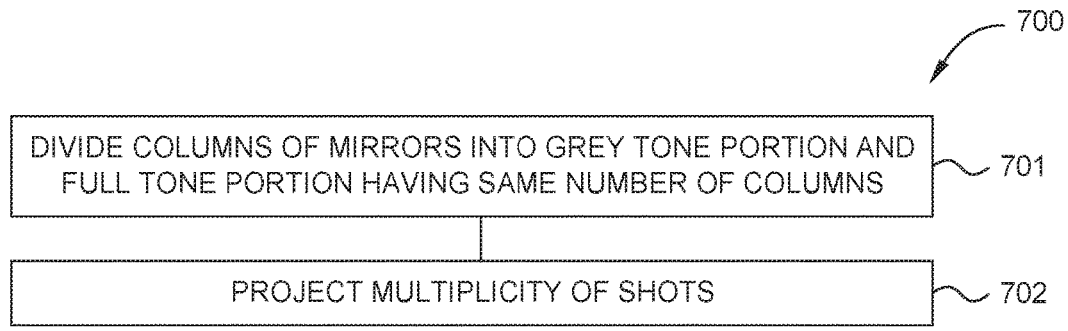
FIG. 7 is a flow diagram of a method of a lithography process according to one embodiment.

FIG. 7 is a flow diagram of a method 700 of a lithography process to write full tone portions 602 and grey tone portions 604 in a single pass. FIGS. 10A-10F are schematic, plane views of a full tone exposure polygon 1002 and a grey tone exposure polygon 1004 during the method 700. At operation 701, as described above, the controller 122 divides the N columns of mirrors 213 into a grey tone group 226 and a full tone group 227 having the same number of columns. At operation 702, when the substrate 120 scans under the image projection system 200 in a single pass the processing unit 106 the projects a multiplicity of shots in the full tone exposure polygon 1002 and the grey tone exposure polygon 1004. The plurality of spatial light modulator pixels of the spatial light modulator 210 form an aggregated shot pattern 1006 as each shot of the plurality of shots is projected to an address point of a plurality of address points 1008. Each address point represents a centroid of a pixel. In one embodiment, which can be combined with other embodiments described herein, the aggregated shot pattern 1006 is a hexagonal close-packed (HCP) pattern, although other patterns may be used for the aggregated shot pattern 1006. The multiplicity of shots is a number of shots to form a full tone portion of the plurality of full tone portions 602 exposed to the full tone dose 606. For example, the multiplicity of shots is between 50 shots and 500 shots.

As shown in FIG. 10A, a first grey tone shot 1010a of the multiplicity of shots from the grey tone group 226 of the spatial light modulator 210 is projected to the full tone exposure polygon 1002 and the grey tone exposure polygon 1004 to at least one first address point 1008a of the plurality of address points 1008. Each shot of the multiplicity of shots in the full tone exposure polygon 1002 and the grey tone exposure polygon 1004 is with the intensity of light emitted from the light source 202. As shown in FIG. 10B, a second grey tone shot 1010b from the grey tone group 226 is projected to the full tone exposure polygon 1002 and the grey tone exposure polygon 1004. As shown in FIG. 10C, projecting the multiplicity of shots from the grey tone group 226 to the full tone exposure polygon 1002 and the grey tone exposure polygon 1004 with the grey tone group 226 is repeated until a final grey tone shot 1010n of the multiplicity of shots is projected to at least one final address point 1008n. The division of the spatial light modulator 210 for the method 700 results in the final grey tone shot 1010n being a half-point of the multiplicity of shots. As shown in FIG. 10D, the full tone group 227 projects a first full tone shot 1012a of the multiplicity of shots inside the full tone exposure polygon 1002 to the at least one first address point 1008a of the plurality of address points 1008. As shown in FIG. 10E, the full tone group 227 projects a second full tone shot 1012b of the inside the full tone exposure polygon 1002 to the at least one second address point 1008b of the plurality of address points 1008. As shown in FIG. 10F, projecting the multiplicity of shots with the full tone group 227 is repeated until a final full tone shot 1012n of the multiplicity of shots is projected to at least one final address point 1008n.

Figure 8:
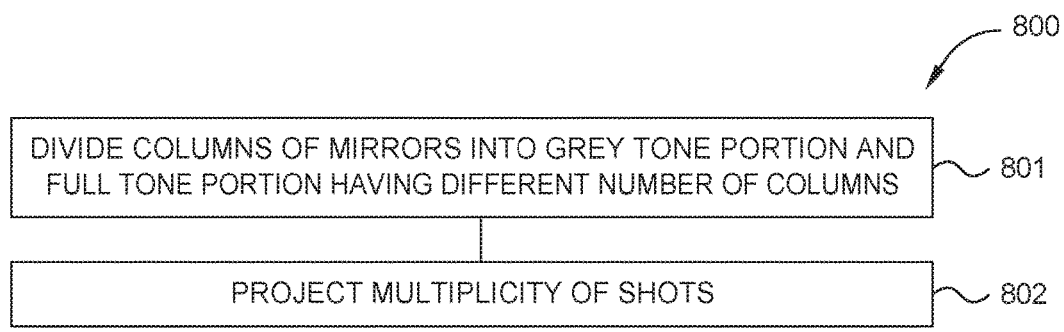
FIG. 8 is a flow diagram of a method of a lithography process according to one embodiment.

FIG. 8 is a flow diagram of a method 800 of a lithography process to write full tone portions 602 and grey tone portions 604 in a single pass. FIGS. 10G-10L are schematic, plane views of a full tone exposure polygon 1002 and a grey tone exposure polygon 1004 during the method 800. At operation 801, as described above, the controller 122 divides the N columns of mirrors 213 into a grey tone group 226 and a full tone group 227 having the different number of columns. The grey tone group 226 has a greater number of columns than the full tone group 227. At operation 802, when the substrate 120 scans under the image projection system 200 in a single pass the processing unit 106 the projects a multiplicity of shots in the full tone exposure polygon 1002 and the grey tone exposure polygon 1004.

As shown in FIG. 10G, a first grey tone shot 1010a of the multiplicity of shots from the grey tone group 226 of the spatial light modulator 210 is projected to the full tone exposure polygon 1002 and the grey tone exposure polygon 1004 to at least one first address point 1008a of the plurality of address points 1008. Each shot of the multiplicity of shots in the full tone exposure polygon 1002 and the grey tone exposure polygon 1004 is with the intensity of light emitted from the light source 202. As shown in FIG. 10H, a second grey tone shot 1010b from the grey tone group 226 is projected to the full tone exposure polygon 1002 and the grey tone exposure polygon 1004. As shown in FIG. 10I, projecting the multiplicity of shots from the grey tone group 226 to the full tone exposure polygon 1002 and the grey tone exposure polygon 1004 with the grey tone group 226 is repeated until a final grey tone shot 1010n of the multiplicity of shots is projected to at least one final address point 1008n. The division of the spatial light modulator 210 for the method 800 results in the shot number of the final grey tone shot 1010n being greater than the shot number of a half-point of the multiplicity of shots. Therefore, a final full tone shot 1012n will not address each of the address points 1008 in the full tone exposure polygon 1002 resulting in the grey tone percentage greater than half of the full tone percentage because a portion of the plurality of address points 1008 inside the full tone exposure polygon 1002 will not addressed twice.

As shown in FIG. 10J, the full tone group 227 projects a first full tone shot 1012a of the multiplicity of shots inside the full tone exposure polygon 1002 to the at least one first address point 1008a of the plurality of address points 1008. As shown in FIG. 10K, the full tone group 227 projects a second full tone shot 1012b of the inside the full tone exposure polygon 1002 to the at least one second address point 1008b of the plurality of address points 1008. As shown in FIG. 10L, projecting the multiplicity of shots with the full tone group 227 is repeated until a final full tone shot 1012n of the multiplicity of shots is projected to at least one final address point 1008n. After the final full tone shot 1012n projected to the at least one final address point 1008n, a portion of the plurality of address points 1008 inside the full tone exposure polygon 1002 are not addressed twice.

Figure 9:
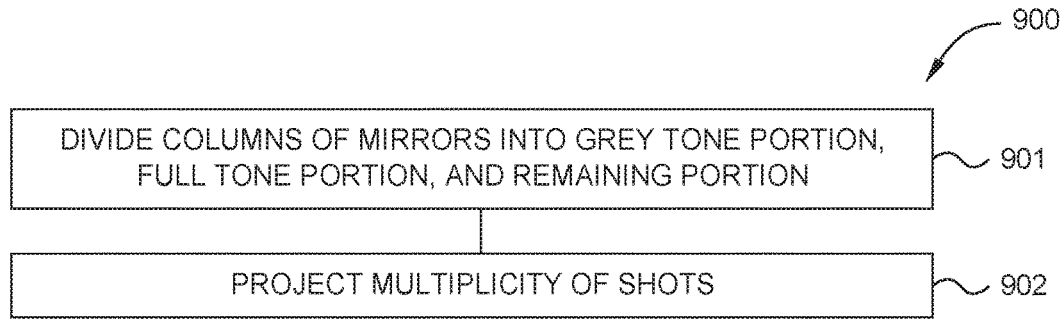
FIG. 9 is a flow diagram of a method of a lithography process according to one embodiment.

FIG. 9 is a flow diagram of a method 900 of a lithography process to write full tone portions 602 and grey tone portions 604 in a single pass. FIGS. 10M-10S are schematic, plane views of a full tone exposure polygon 1002 and a grey tone exposure polygon 1004 during the method 900. At operation 901, as described above, the controller 122 divides the N columns of mirrors 213 into a grey tone group 226, a full tone group 227, and a remaining group 228. The grey tone group 226 and the full tone group 227 have a same number of columns. At operation 902, when the substrate 120 scans under the image projection system 200 in a single pass the processing unit 106 the projects a multiplicity of shots in the full tone exposure polygon 1002 and the grey tone exposure polygon 1004.

As shown in FIG. 10M, a first grey tone shot 1010a of the multiplicity of shots from the grey tone group 226 of the spatial light modulator 210 is projected to the full tone exposure polygon 1002 and the grey tone exposure polygon 1004 to at least one first address point 1008a of the plurality of address points 1008. Each shot of the multiplicity of shots in the full tone exposure polygon 1002 and the grey tone exposure polygon 1004 is with the intensity of light emitted from the light source 202. As shown in FIG. 10N, a second grey tone shot 1010b from the grey tone group 226 is projected to the full tone exposure polygon 1002 and the grey tone exposure polygon 1004. As shown in FIG. 10O, projecting the multiplicity of shots from the grey tone group 226 to the full tone exposure polygon 1002 and the grey tone exposure polygon 1004 with the grey tone group 226 is repeated until a final grey tone shot 1010n of the multiplicity of shots is projected to at least one final address point 1008n. The division of the spatial light modulator 210 for the method 900 results in each address point of the plurality of address points 1008 inside the grey tone exposure polygon 1004 being addressed.

Figure 11:
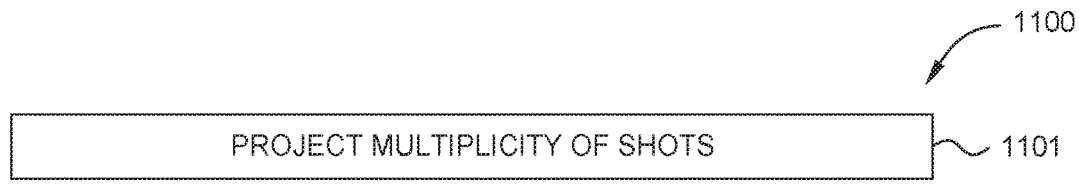
FIG. 11 is a flow diagram of a method of a lithography process according to one embodiment.
Figure 10S:
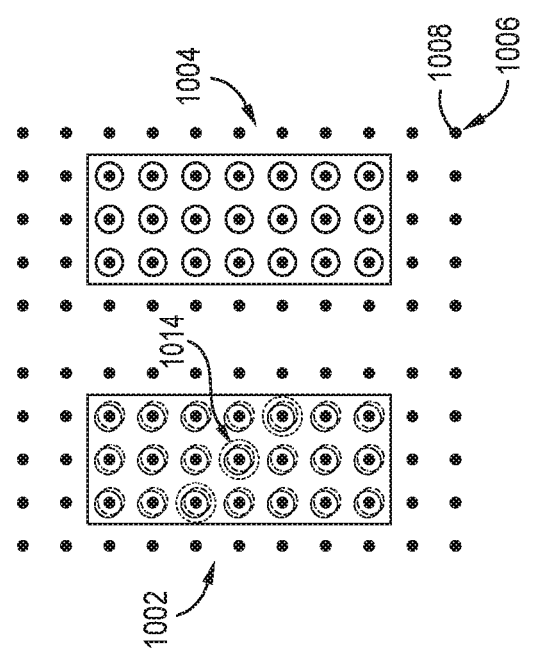

As shown in FIG. 10P, the full tone group 227 projects a first full tone shot 1012a of the multiplicity of shots inside the full tone exposure polygon 1002 to the at least one first address point 1008a of the plurality of address points 1008. As shown in FIG. 10Q, the full tone group 227 projects a second full tone shot 1012b of the inside the full tone exposure polygon 1002 to the at least one second address point 1008b of the plurality of address points 1008. As shown in FIG. 10R, projecting the multiplicity of shots with the full tone group 227 is repeated until a final full tone shot 1012n of the multiplicity of shots is projected to at least one final address point 1008n. As shown in FIG. 10S, the remaining group 228 of the spatial light modulator 210 projects remaining shots 1014 of the multiplicity of shots to address points inside the full tone exposure polygon 1002 resulting in half of the full tone percentage greater than the grey tone percentage. In the embodiment, which can be combined with other embodiments described herein, with the remaining group 228 of the spatial light modulator 210 projecting remaining shots 1014 of the multiplicity of shots to address points inside the grey tone exposure polygon 1004, half of the full tone percentage greater is less than the grey tone percentage FIG. 11 is a flow diagram of the method 1100 of a lithography process to write full tone portions 602 and grey tone portions 604 in a single pass. FIGS. 12A-12F are schematic, plane views of a full tone exposure polygon 1002 and a grey tone exposure polygon 1004 during the method 1100. The controller 122 divides the plurality of spatial light modulator pixels of the spatial light modulator 210 temporally by first shots and second shots of a multiplicity of shots in the full tone exposure polygon 1002 and the grey tone exposure polygon 1004. The controller 122 includes a shot counter to temporally divide the first shots and second shots of the multiplicity of shots. The controller 122 includes a control loop for analog emission of the intensity of light from the light source 202. The control loop provides for analog emission of the intensity at first shots and second shots at predetermined locations of across the photoresist 601.

When the substrate 120 scans under the image projection system 200 in a single pass, the processing unit 106 the projects a multiplicity of shots. First shots and second shots of the multiplicity of shots are projected in the full tone exposure polygon 1002. In one embodiment, which can be combined with other embodiments described herein, as shown, only first shots of the multiplicity of shots are projected in the grey tone exposure polygon 1004. In another embodiment, which can be combined with other embodiments described herein, only second shots of the multiplicity of shots are projected in the grey tone exposure polygon 1004.

To facilitate explanation, FIG. 11 and FIGS. 12A-12F will be described with reference to grey tone shots of the multiplicity of shots projected in the grey tone exposure polygon 1004, and grey tone shots and full tone shots of the multiplicity of shots projected in the full tone exposure polygon 1002. It is to be noted, in one embodiment, which can be combined with other embodiments described herein, as shown in FIGS. 12A-12F, the grey tone shots are first shots and the full tone shots are second shots, and in another embodiment, which can be combined with other embodiments described herein, the grey tone shots are second shots and the full tone shots are first shots.

At operation 1101, a multiplicity of shots is projected to the full tone exposure polygon 1002 and the grey tone exposure polygon 1004. As shown in FIG. 12A, a grey tone shot 1210a of the multiplicity of shots that is a grey tone shot is projected to the full tone exposure polygon 1002 and the grey tone exposure polygon 1004 inside the full tone exposure polygon 1002 and the grey tone exposure polygon 1004 to at least one first address point 1008a of the plurality of address points 1008. As shown in FIG. 12B, a full tone shot 1210b of the multiplicity of shots that is a full tone shot is projected inside the full tone exposure polygon 1002 to at least one second address point 1008b when the substrate 120 scans under the image projection system 200. In one embodiment, which can be combined with other embodiments described herein, as shown in FIG. 12C, a half-point shot 1210h of the multiplicity of shots is a grey tone shot projected inside the full tone exposure polygon 1002 and the grey tone exposure polygon 1004 to at least one final address point 1008n. In another embodiment, which can be combined with other embodiments described herein, the half-point shot 1210h of the multiplicity of shots is a full tone shot projected inside the full tone exposure polygon 1002.

After the half-point shot 1210h of the multiplicity of shots, the plurality of grey tone portions 604 have the grey tone shot address points of the plurality of address points 1008 exposed with the a first percentage of the intensity. The plurality of full tone portions 602 have grey tone shot address points exposed to the second percentage of the intensity, i.e., the grey tone percentage of the intensity, and full tone shot address points exposed to a first percentage of the intensity. In one embodiment, which can be combined with other embodiments described herein, the second intensity is less than the first intensity. The combination of the first intensity and the second intensity, i.e., the full tone percentage of the intensity, corresponds to the full tone dose 606. The second intensity, i.e., the grey tone percentage, corresponds to the grey tone dose 608.

In one embodiment, which can be combined with other embodiments described herein, as shown in FIG. 12D, a 1210d of the multiplicity of shots, after the half-point shot 1210h that is the grey tone shot, is a full tone shot projected to the full tone exposure polygon 1002 to at least one first address point 1008a of the plurality of address points 1008. In another embodiment, which can be combined with other embodiments described herein, the shot 1210d of the multiplicity of shots, after the half-point shot 1210h that is the full tone shot, is a full tone shot projected to the full tone exposure polygon 1002. In embodiments, which can be combined with other embodiments described herein, with the grey tone shots as second shots and the full tone shots are first shots, after the half-point shot 1210h that is the grey tone shot, the shot 1210d is a grey tone shot projected to the full tone exposure polygon 1002 and the grey tone exposure polygon 1004. As shown in FIG. 12E, a full tone shot 1210e of the multiplicity of shots after the half-point shot 1210h is projected inside the full tone exposure polygon 1002 and the grey tone exposure polygon 1004 to at least one second address point 1008b when the substrate 120 scans under the image projection system 200. As shown in FIG. 12F, a final shot 1210n of the multiplicity of shots that is a full tone shot is projected inside the full tone exposure polygon 1002 to at least one final address point 1008n.

With the multiplicity of shots, the plurality of grey tone portions 604 have the full tone shot and grey tone shot address points of the plurality of address points 1008 exposed with the second intensity. The plurality of full tone portions 602 have full tone shot and grey tone shot address points exposed to the combination of the second intensity and the first intensity. The temporal division of the grey tone shots and full tone shots of the multiplicity of shots and capability of analog emission of the first intensity and the second intensity will allow for the full tone dose 606 for the plurality of full tone portions 602 and grey tone dose 608 for the plurality of grey tone portions 604 to vary across the photoresist 601.

In summation, a system, a software application, and a method of a lithography process to write full tone portions and grey tone portions in a single pass are provided. The single pass provides greater for greater throughput. The temporal division and spatial division of the spatial light modulator of the system between first shots and second shots of the plurality of shots provides for analog emission of the second intensity and the first intensity from the light source in the single pass. The analog emission of the second tone and the first intensity allows for the full tone dose for each full tone portion of the plurality of full tone portions and the grey tone dose for each grey tone portion of the plurality of grey tone portions to vary across the photoresist. The variation of the full tone dose and the grey tone dose across the photoresist may accommodate for variation due to photoresist thickness, non-uniformity of the developer during the development of the photoresist, non-uniformity in etch transfer processing, and any other processes before or after the lithography process.

While the foregoing is directed to examples of the present disclosure, other and further examples of the disclosure may be devised without departing from the basic scope thereof, and the scope thereof is determined by the claims that follow.

What is claimed is:

1. A system, comprising:
   a slab;
   a moveable stage disposable over the slab, the stage configured to support a substrate having a photoresist disposed thereon;
   an encoder coupled to the stage configured to provide a position of the substrate to a controller configured to provide mask pattern data to a lithography system, the mask pattern data having a plurality of full tone exposure polygons and a plurality of grey tone exposure polygons; and
   a lithography system support coupled to the slab having an opening to allow the stage to pass thereunder, wherein:
      the lithography system has a processing unit with a plurality of image projection systems that receive the mask pattern data;
      each image projection system comprising a spatial light modulator with a plurality of spatial light modulator pixels to project a multiplicity of shots; and
      the controller is configured to divide the plurality of spatial light modulator pixels spatially by at least a grey tone group of spatial light modulator pixels and a full tone group of spatial light modulator pixels;
      when divided by the controller,
         the grey tone group of spatial light modulator pixels is operable to project a first number of the multiplicity of shots to the plurality of full tone exposure polygons and the plurality of grey tone exposure polygons; and
         the full tone group of spatial light modulator pixels is operable to project a second number of the multiplicity of shots to the plurality of full tone exposure polygons.

2. The system of claim 1, wherein each spatial light modulator pixel of the plurality of spatial light modulator pixels of the spatial light modulator is individually controllable and are configured to project a write beam corresponding to a pixel of a plurality of pixels.

3. The system of claim 2, wherein the spatial light modulator is an array of electrically addressable elements.

4. The system of claim 3, wherein the plurality of spatial light modulator pixels of at least one electrically addressable element are mirrors that are spatially divided by the grey tone group and the full tone group.

5. The system of claim 1, wherein:
   the first number of the multiplicity of shots equal to the second number of the multiplicity of shots results in a grey tone dose equal to half of a full tone dose;
   the first number less than the second number results in the grey tone dose less than half of the full tone dose; and
   the first number greater than the second number results in the grey tone dose greater than half of the full tone dose.

6. A non-transitory computer-readable medium storing instructions that, when executed by a processor, cause a computer system to perform the steps of:
providing a mask pattern data having a plurality of exposure polygons to a processing unit of a lithography system, the processing unit having a plurality of image projection systems that receive the mask pattern data, the mask pattern data having a plurality of full tone exposure polygons and a plurality of grey tone exposure polygons; and
in a single scan of a substrate having a photoresist disposed thereon under the plurality of image projection systems:
projecting at least a first number of a multiplicity of shots to the plurality of full tone exposure polygons and the plurality of grey tone exposure polygons with a grey tone group of spatial light modulator pixels; and
projecting at least a second number of the multiplicity of shots to the plurality of full tone exposure polygons with a full tone group of spatial light modulator pixels.

7. The non-transitory computer-readable medium of claim 6, wherein each image projection system comprises a spatial light modulator with the grey tone group of spatial light modulator pixels and the full tone group of spatial light modulator pixels to project the multiplicity of shots to a plurality of address points of an aggregated shot pattern.

8. The non-transitory computer-readable medium of claim 7, wherein the multiplicity of shots form a plurality of grey tone portions having grey tone shot address points exposed to the first number of the multiplicity of shots, and the multiplicity of shots form a plurality of full tone portions having full tone shot address points exposed to the first number and the second number of the multiplicity of shots.

9. The non-transitory computer-readable medium of claim 6, wherein the first number of the multiplicity of shots corresponds to a grey tone dose and a combination of the first number and the second number of multiplicity of shots corresponds to full tone dose.

10. The non-transitory computer-readable medium of claim 9, wherein:
the first number of the multiplicity of shots equal to the second number of the multiplicity of shots results in the grey tone dose equal to half of the full tone dose;
the first number less than the second number results in the grey tone dose less than half of the full tone dose; and
the first number greater than the second number results in the grey tone dose greater than half of the full tone dose.

11. The non-transitory computer-readable medium of claim 6, wherein a light beam generated by a light source of each image projection system has an intensity.

12. The non-transitory computer-readable medium of claim 11, wherein the intensity is about 10 mJ/cm$^2$ to about 200 mJ/cm$^2$.

13. A method, comprising:
providing a mask pattern data having a plurality of exposure polygons to a processing unit of a lithography system, the processing unit having a plurality of image projection systems that receive the mask pattern data, the mask pattern data having a plurality of full tone exposure polygons and a plurality of grey tone exposure polygons; and
in a single scan of a substrate having a photoresist disposed thereon under the plurality of image projection systems:
projecting at least a first number of a multiplicity of shots to the plurality of full tone exposure polygons and the plurality of grey tone exposure polygons with a grey tone group of spatial light modulator pixels; and
projecting at least a second number of the multiplicity of shots to the plurality of full tone exposure polygons with a full tone group of spatial light modulator pixels.

14. The method of claim 13, wherein each image projection system comprises a spatial light modulator with the grey tone group of spatial light modulator pixels and the full tone group of spatial light modulator pixels to project the multiplicity of shots to a plurality of address points of an aggregated shot pattern.

15. The method of claim 14, wherein the multiplicity of shots form a plurality of grey tone portions having grey tone shot address points exposed to the first number of the multiplicity of shots, and the multiplicity of shots form a plurality of full tone portions having full tone shot address points exposed to the first number and the second number of the multiplicity of shots.

16. The method of claim 13, wherein the first number of the multiplicity of shots corresponds to a grey tone dose and a combination of the first number and the second number of multiplicity of shots corresponds to full tone dose.

17. The method of claim 16, wherein:
the first number of the multiplicity of shots equal to the second number of the multiplicity of shots results in the grey tone dose equal to half of the full tone dose;
the first number less than the second number results in the grey tone dose less than half of the full tone dose; and
the first number greater than the second number results in the grey tone dose greater than half of the full tone dose.

18. The method of claim 13, wherein a light beam generated by a light source of each image projection system has an intensity.

19. The method of claim 18, wherein the intensity is about 10 mJ/cm$^2$ to about 200 mJ/cm$^2$.

20. The method of claim 13, wherein the multiplicity of shots is between 50 shots and 500 shots.

* * * * *